(12) United States Patent
Seino (10) Patent No.: US 6,313,702 B1
(45) Date of Patent: Nov. 6, 2001

(54) PHASE CORRECTION AMPLIFIER AND A FEED-FORWARD AMPLIFIER USING THE SAME

(75) Inventor: Yasushi Seino, Sendai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/491,149

(22) Filed: Jan. 26, 2000

(30) Foreign Application Priority Data

Mar. 1, 1999 (JP) .................................................. 11-052406

(51) Int. Cl.[7] .......................................................... H03F 1/26
(52) U.S. Cl. ............................................. 330/149; 330/151
(58) Field of Search ................................. 330/151; 4/149

(56) References Cited

U.S. PATENT DOCUMENTS

| 4,258,328 | * | 3/1981 | Prevot et al. | 330/149 |
|---|---|---|---|---|
| 5,565,814 | * | 10/1996 | Fukuchi | 330/151 |
| 5,796,307 | * | 8/1998 | Kumagai et al. | 330/151 |
| 5,815,036 | * | 9/1998 | Yoshikawa et al. | 330/151 |
| 6,172,560 | * | 1/2001 | Yamashita et al. | 330/151 |
| 6,172,567 | * | 1/2001 | Ueno et al. | 330/285 |

FOREIGN PATENT DOCUMENTS

| 1-198809 | 8/1989 | (JP) . |
|---|---|---|
| 1-200807 | 8/1989 | (JP) . |
| 4-70203 | 3/1992 | (JP) . |
| 4-83406 | 3/1992 | (JP) . |
| 4-83407 | 3/1992 | (JP) . |
| 4-233809 | 8/1992 | (JP) . |
| 4-233811 | 8/1992 | (JP) . |
| 4-286209 | 10/1992 | (JP) . |

* cited by examiner

Primary Examiner—Robert Pascal
Assistant Examiner—Khanh V. Nguyen
(74) Attorney, Agent, or Firm—Rosenman & Colin, LLP (57) ABSTRACT

A phase correction amplifier according to the present invention includes; a GaAs field effect transistor; and a Si field effect transistor or a Si bipolar transistor; wherein the GaAs field effect transistor and the Si field effect transistor or the Si bipolar transistor are cascade-connected each other through a variable attenuator. Further, a feed-forward amplifier includes the above phase correction amplifier and is constituted by: a distortion extracting loop consisting of a main amplifier signal path and a linear Signal path in order to distribute a transmission signal; a directional coupler for receiving an output signal through the main amplifier signal path and an output signal through the linear signal path; a distortion eliminating loop consisting of a sub-amplifier signal path and a linear signal path in order to input an output signal from the directional coupler: and a power compositor for receiving an output signal through the sub-amplifier signal path and an output signal through the linear signal path, and coupling both the output signals.

1 Claim, 12 Drawing Sheets

PHASE CORRECTION AMPLIFIER AND A FEED-FORWARD AMPLIFIER USING THE SAME

BACKGROUND OF THE INVENTION

1. Field of the Invention

The present invention relates to a phase correction amplifier for correcting a phase characteristic, and a feed-forward amplifier using the above phase correction amplifier, which can be applied to a transmitting power amplifier used, for example, in a radio base station.

2. Description of the Related Art

A power amplifier used for a transmitting apparatus in a mobile radio communication system has a structure in which an amplification is performed within a linear area of an amplification characteristic in order to realize low signal distortion. In this case, however, there is a problem in which this structure has a low power efficiency.

Accordingly, in actual use of the power amplifier, an operation area of the amplification is extended until an output of the power amplifier reaches in the vicinity of a saturation area in order to improve the power efficiency. In this case, when a peak envelope power (i.e., an instantaneous power) of an input signal becomes large, the signal distortion also becomes large.

For example, in a power amplifier used in a PDC (Personal Digital Cellular) system for collectively amplifying and transmitting signals on a plurality of channels, the signal distortion at mutual modulation becomes large compared to amplification of the transmitting signal on a single channel. In a CDMA (Code Division Multiple Access) system, since the peak envelope power becomes large due to coincidence of phases in carrier wave when using large multiplexed codes.

Conventionally, there are known many structures to compensate for the signal distortion in the power amplifier. For example, a pre-distortion type distortion compensator, a feed-forward type amplifier consisting of a distortion extraction loop and a distortion eliminating loop, etc., have been known.

Accordingly, the present invention relates to an improvement of the feed-forward type amplifier by correcting the phase characteristic of a phase correction amplifier.

SUMMARY OF THE INVENTION

The object of the present invention is to provide a phase correction amplifier which can correct a phase characteristic thereof and can be applied to a transmitting power amplifier used, for example, in a radio base station.

Another object of the present invention is to provide a feed-forward amplifier using the above phase correction amplifier.

In accordance with a first aspect of the present invention, there is provided a phase correction amplifier including: a GaAs field effect transistor; and a Si field effect transistor or a Si bipolar transistor; wherein the GaAs field effect transistor and the Si field effect transistor or the Si bipolar transistor are cascade-connected each other.

In accordance with a second aspect of the present invention, there is provided a phase correction amplifier including: a GaAs field effect transistor; and a Si field effect transistor or a Si bipolar transistor; wherein the GaAs field effect transistor and the Si field effect transistor or the Si bipolar transistor are cascade-connected each other through a variable attenuator.

In accordance with a third aspect of the present invention, there is provided a feed-forward amplifier including: a distortion extracting loop consisting of a main amplifier signal path and a linear signal path in order to distribute a transmission signal; a directional coupler for receiving an output signal through the main amplifier signal path and an output signal through the linear signal path; a distortion eliminating loop consisting of a sub-amplifier signal path and a linear signal path in order to input an output signal from the directional coupler; and a power compositor for receiving an output signal through the sub-amplifier signal path and an output signal through the linear signal path, and coupling both the output signals.

In a preferred embodiment, each of the main amplifier and the sub-amplifier is constituted by a phase correction amplifier comprising a GaAs field effect transistor, and a Si field effect transistor or a Si bipolar transistor, wherein the GaAs field effect transistor and the Si field effect transistor or the Si bipolar transistor are cascade-connected each other through a variable attenuator.

DESCRIPTION OF THE PREFERRED EMBODIMENTS

Before describing preferred embodiments, a conventional art and its problem will be explained in detail with reference to the drawings.

Figure 8:
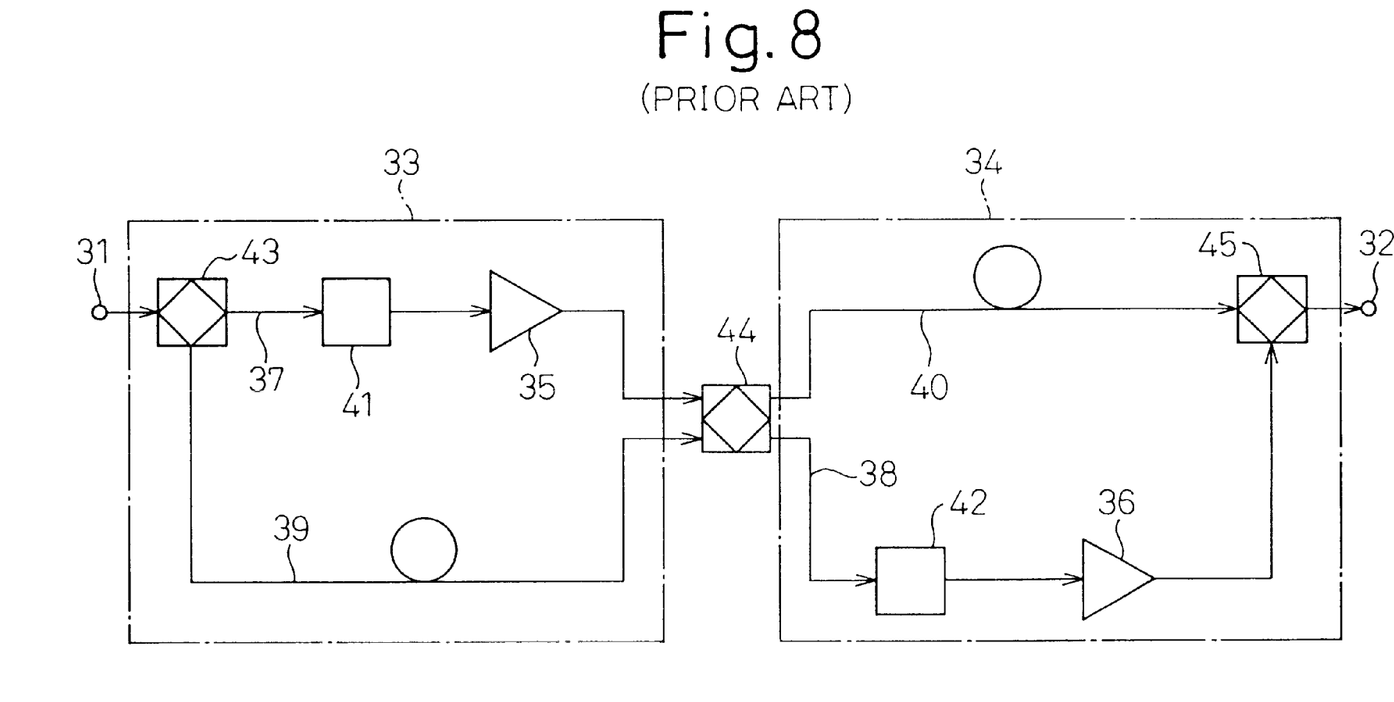
FIG. 8 shows a feed-forward amplifier in a conventional art.

FIG. 8 shows a feed-forward amplifier in a conventional art. The feed-forward amplifier is constituted by a distortion extracting loop 33 and a distortion eliminating loop 34 connected to the distortion extracting loop 33 through a directional coupler 44.

The distortion extracting loop 33 includes an input terminal 31, a power distributor 43 connected to the input terminal 31, a vector adjustor 41 connected to the power distributor 43, and a main amplifier 35 connected to the vector adjustor 41 and the directional coupler 44. Further, 37 is a main amplifier signal path (or, simply, a signal path 37) connecting the power distributor 43 to the main amplifier 35 through the vector adjustor 41, and 39 is a linear signal path (or, simply, a signal path 39) connecting the power distributor 43 to the directional coupler 44.

On the other hand, the distortion eliminating loop 34 includes a vector adjuster 42 connected to the directional coupler 44, a sub-amplifier 36 connected to the vector adjuster 42, a power compositor 45 and an output terminal 32. Further, 38 is a sub-amplifier signal path (or, simply, a signal path 38) connecting the directional coupler 44 to the sub-amplifier 36 through the vector adjustor 42, and 40 is a linear signal path (or, simply, a signal path 40) connecting the directional coupler 44 to the power compositor 45.

In the distortion extracting loop 33, an input signal is distributed by the power distributor 43 to the signal path 37 and signal path 39. The input signal on the signal path 37 is input to the main amplifier 35 through the vector adjustor 41 and amplified by the main amplifier 35. An amplified signal is input to the directional coupler 44. On the other hand, the input signal on the signal path 39 is directly input to the directional coupler 44.

In the distortion eliminating loop 34, the signal amplified by the main amplifier 35 is input from the directional coupler 44 to the signal path 40, and a distortion component of the signal is input from the directional coupler 44 to the signal path 38. The distortion component is input to the sub-amplifier 36 through the vector adjustor 42 and amplified by the sub-amplifier 36. Further, the signal from the path 40 and another signal from the sub-amplifier 36 are composited by the power compositor 45 after inversion of the phase of any one of these signals. As a result, it is possible to output an amplified output signal, in which the distortion component is cancelled, from the output terminal 32. In general, the main amplifier 35 and the sub-amplifier 36 are generally constituted by MOS FETs.

Figure 9:
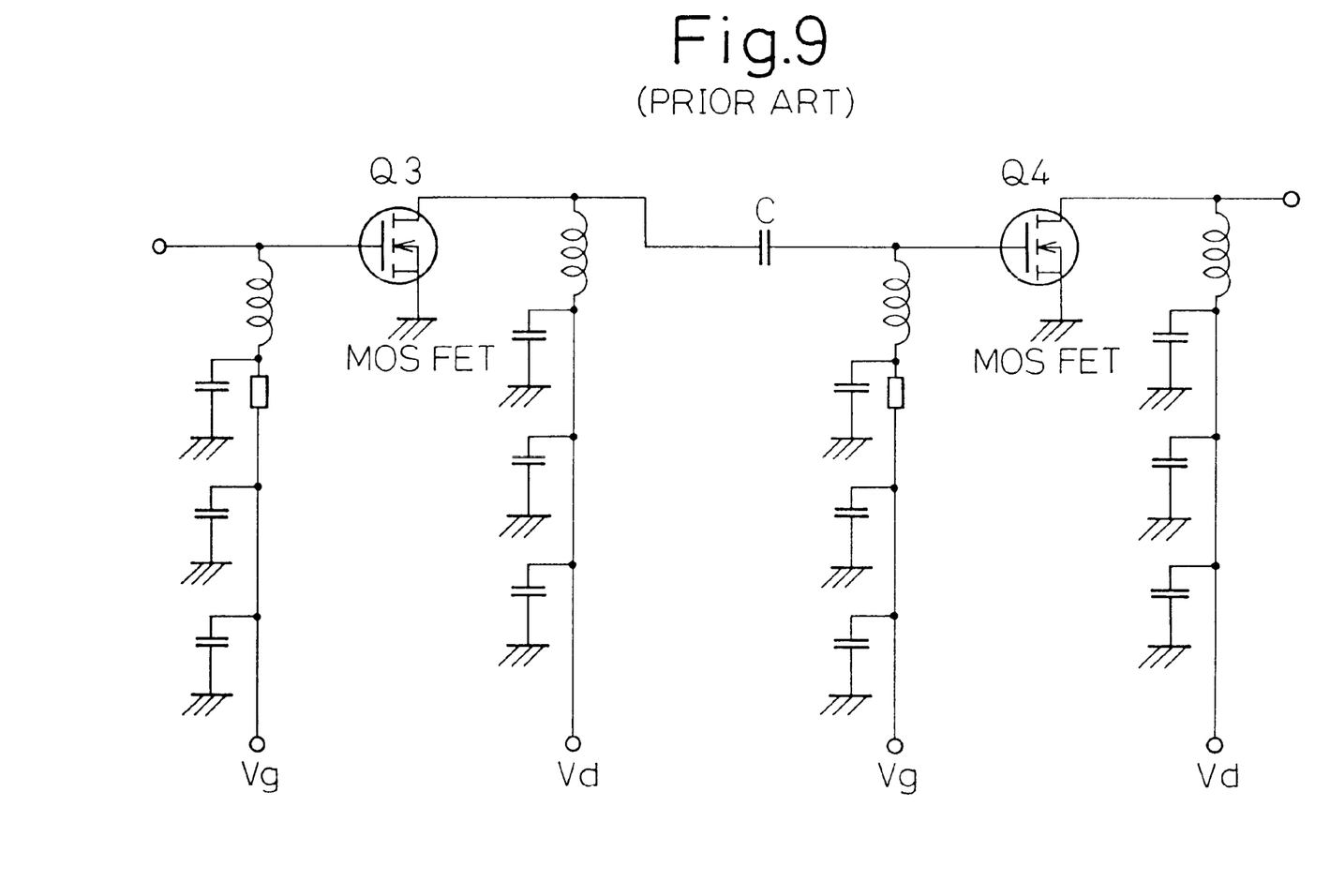
FIG. 9 shows a detailed circuit of a main amplifier and a sub-amplifier.

FIG. 9 shows a detailed circuit of the main amplifier 35 and the sub-amplifier 36. Q3 and Q4 are MOS FETS, C is a coupling condenser, Vg denotes a gate bias voltage, and Vd denotes a drain voltage. As shown in the drawing, the amplifier is constituted by two MOS FETs Q3 and Q4 which are coupled through the coupling condenser C. In general, the drain voltage Vd is 25V. Further, although the remaining circuit, which is constituted by condensers, inductors and resistors, is shown as a lumped parameter circuit, this circuit can be constituted by a distributed constant circuit using strip lines so that matching circuits and bias circuits are shown in the drawing.

Figure 10A:
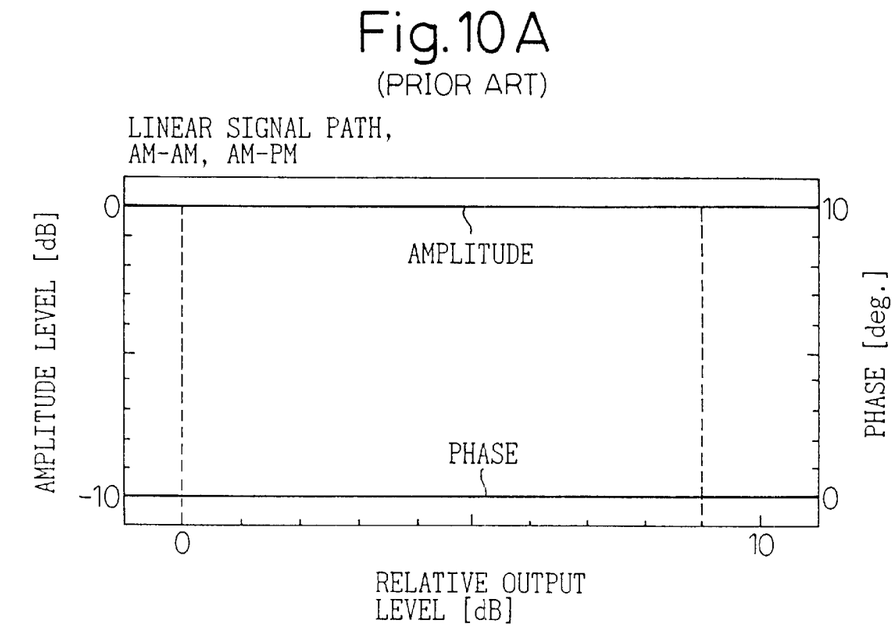
FIG. 10A is a graph for explaining a relationship between an amplitude level/phase degree and a relative output level for the AM-AM and the AM-PM characteristics on the linear signal path.
Figure 10B:
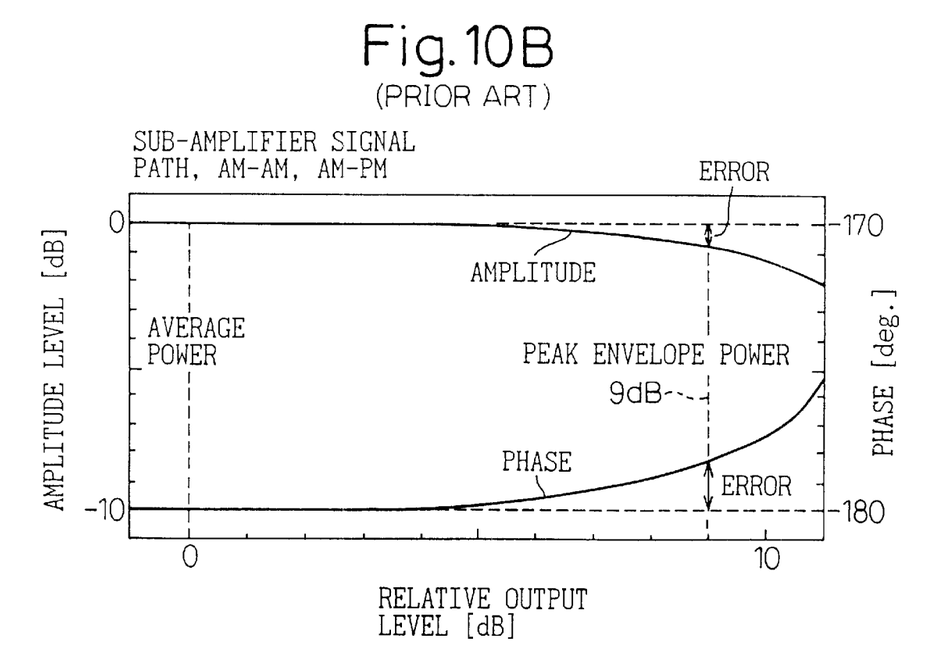
FIG. 10B is a graph for explaining a relationship between an amplitude level/phase degree and a relative output level for the AM-AM and the AM-PM characteristics on the sub amplifier signal path.

FIG. 10A is a graph for explaining a relationship between an amplitude level/phase degree and a relative output level for an AM-AM and AM-PM characteristics on the linear signal path, and FIG. 10B is a graph for explaining a relationship between an amplitude level/phase degree and a relative output level for AM-AM and AM-PM characteristics on the sub-amplifier signal path. Further, FIG. 10C is a graph for explaining a relationship between quantity of suppressed distortion and frequencies, and FIG. 10D is another graph for explaining a relationship between quantity of suppressed distortion and frequencies.

In FIGS. 10A and 10B, the AM-AM characteristic represents the characteristic between fluctuation of an input level and fluctuation of an output level, and the AM-PM represents the characteristic between fluctuation of an input level and fluctuation of an output phase. In this case, the graph in FIG. 10A is in the case of fluctuation on the linear signal path 40 in the distortion eliminating loop 34 when the MOS FET amplifier is used as the sub-amplifier 36, and the graph in FIG. 10B is in the case of fluctuation on the sub-amplifier signal path 38 in the distortion eliminating loop 34.

Figure 10C:
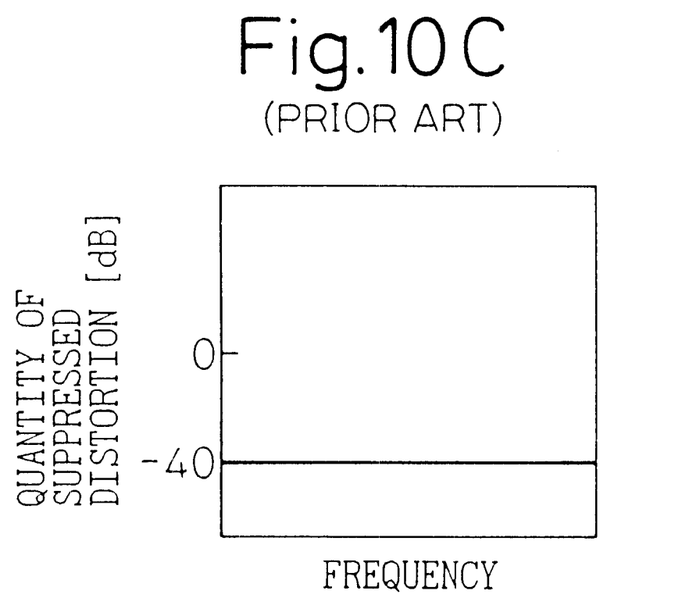
FIG. 10C is a graph for explaining a relationship between quantity of suppressed distortion and frequencies.
Figure 10D:
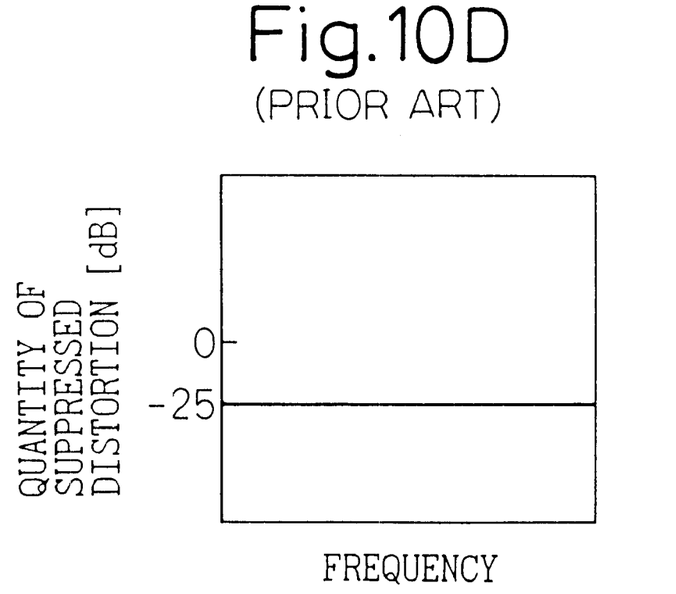
FIG. 10D is another graph for explaining a relationship between quantity of suppressed distortion and frequencies.

As shown in FIG. 10C, when an average power (or, an effective power) is 0 (dB), and when the peak envelope power is 9 (dB), the quantity (dB) of the suppressed distortion within a band of signal frequency at the average power is −40 (dB). On the other hand, as shown in FIG. 10D, when the relative output level of the peak envelope power is 9 (dB), the quantity (dB) of the suppressed distortion is −25 (dB). That is, the peak envelope power becomes larger, the quantity of the suppressed distortion becomes considerably smaller.

In mobile communication systems, there are an increased of the number of subscribers and a requirement for a large capacity for data transmission in order to handle multimedia. For example, there are increases in the number of carrier frequencies in a PDC (Personal Digital Cellular) system and increase of multiplexed codes in a CDMA (Code Division Multiple Access) system. As a result of increase of these parameters, the peak envelope power of the carrier frequency becomes larger, and the signal distortion becomes larger, even if the feed-forward amplifier is applied to the mobile communication system.

That is, as shown by the AM-AM and AM-PM characteristics in FIG. 10A, if the AM-AM and AM-PM characteristics are linear on the sub-amplifier signal path 38, it may be possible to eliminate the signal distortion. However, in actuality, since the sub-amplifier 36 includes non-linear elements, the sub-amplifier 36 has non-linear characteristic as shown in FIG. 10B so that the amplitude and phase cannot follow instantaneous increase of the peak envelope power. As a result, there is problem in which the quantity of suppressed distortion is decreased.

Accordingly, in order to resolve the above problems, the present invention aims to correct the phase characteristic, and to maintain the quantity of sufficiently suppressed distortion for the feed-forward amplifier even if the peak envelope power is increased.

Figure 1:
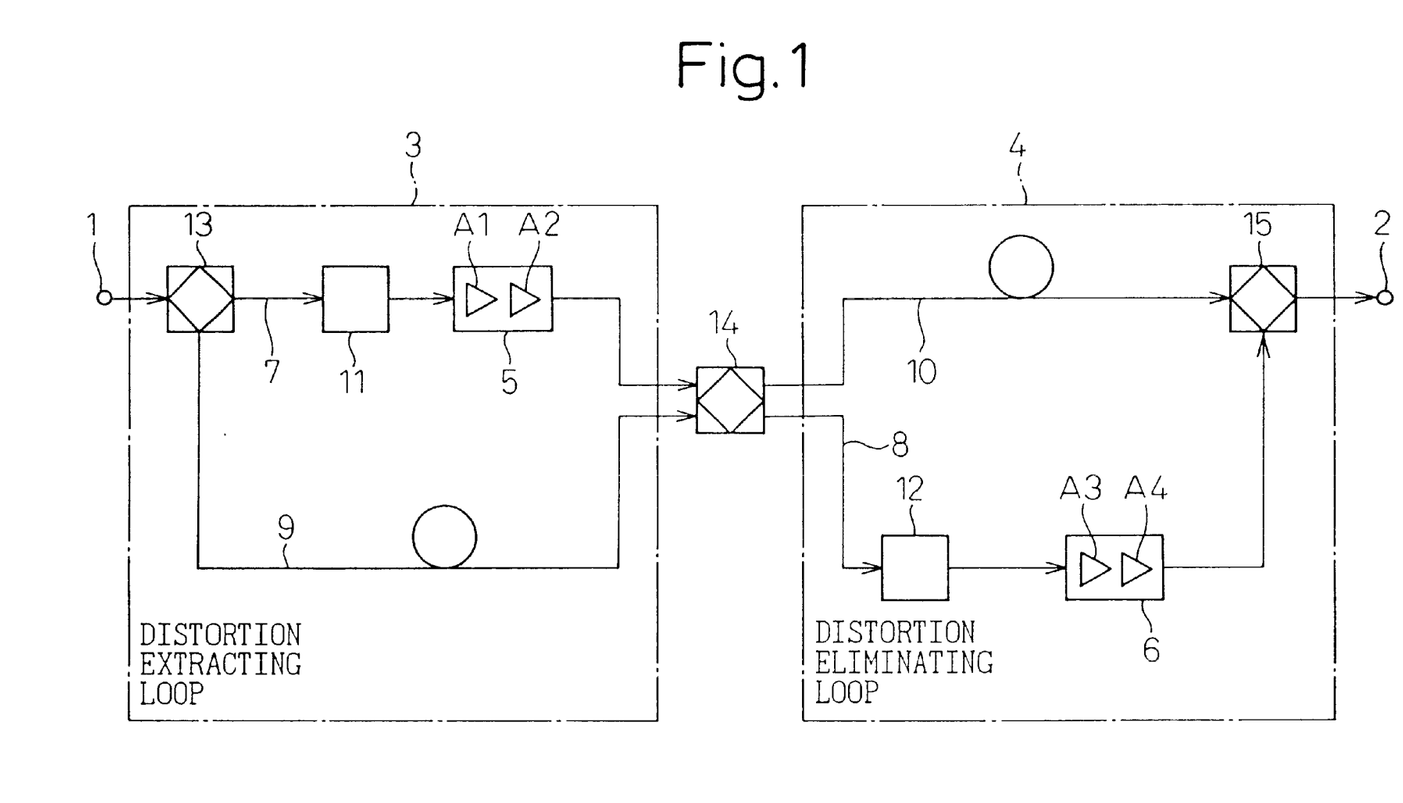
FIG. 1 shows a feed-forward amplifier according to an embodiment of the present invention.

FIG. 1 shows a feed-forward amplifier according to an embodiment of the present invention. In FIG. 1, reference number 1 is an input terminal, 2 is an output terminal, 3 is a distortion extracting loop, 4 is a distortion eliminating loop, 5 is a main amplifier, 6 is a sub-amplifier, 7 is a main amplifier signal path, 8 is a sub-amplifier signal path, 9 and 10 are linear signal paths, 11 and 12 are vector adjusters, 13 is a power distributor, 14 is a directional coupler, 15 is a power compositor, A1 to A4 are transistors.

As explained in the following drawings, in the present invention, the main amplifier 5 in the distortion extracting loop 3 and the sub-amplifier 6 in the distortion eliminating loop 4 are constituted by transistors each having different phase characteristic. For example, the preceding transistors A1 and A3 in the main and sub-amplifiers 5 and 6 are formed of GaAs field effect transistor (GaAs FET), and the following transistors A2 and A4 are formed of either Si field effect transistor (MOS FET) or Si bipolar transistor. In this case, the GaAs FET and MOS FET (or Si-bipolar) have different (i.e., inverse) phase characteristics so that it is possible to constitute a phase correction amplifier according to the present invention by combining these transistors.

The transistors A1 and A2 (i.e., GaAs FET and the MOS FET) are cascade-connected each other. This means that, as explained below, when the GaAs FET is used as the preceding transistor (A1), the MOS FET is used as the following transistor (A2), and further, when the MOS FET is used as the preceding transistor (A1), the GaAs FET is used as the following transistor (A2).

Similarly, the transistors A3 and A4 are cascade-connected each other. That is, when the GaAs FET is used as the preceding transistor (A3), the MOS FET is used as the following transistor (A4), and further, when the MOS FET is used as the preceding transistor (A3), the GaAs FET is used as the following transistor (A4).

In this embodiment, the GaAs FET is used as the preceding transistor, and the MOS FET (or Si-bipolar) is used as the following transistor. Further, in general, 10 (V) is used as the power voltage of the GaAs FET, and 20 to 30 (V) are used as the power voltage of the MOS FET. Accordingly, it is preferable to use the MOS FET having a high power voltage as the following transistors A2 and A4 in view of an output power, etc.

Figure 2A:
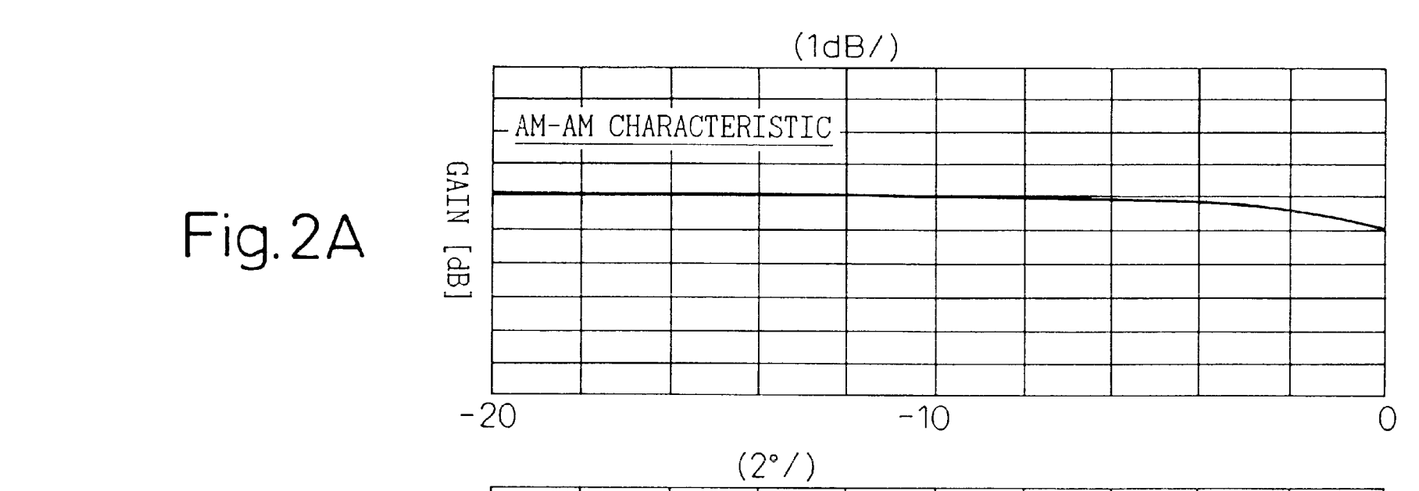
FIG. 2A is a graph for explaining a relationship between an amplitude level (Gain, dB) and an input level for an AM-AM characteristic in the case of a GaAs FET.
Figure 2B:
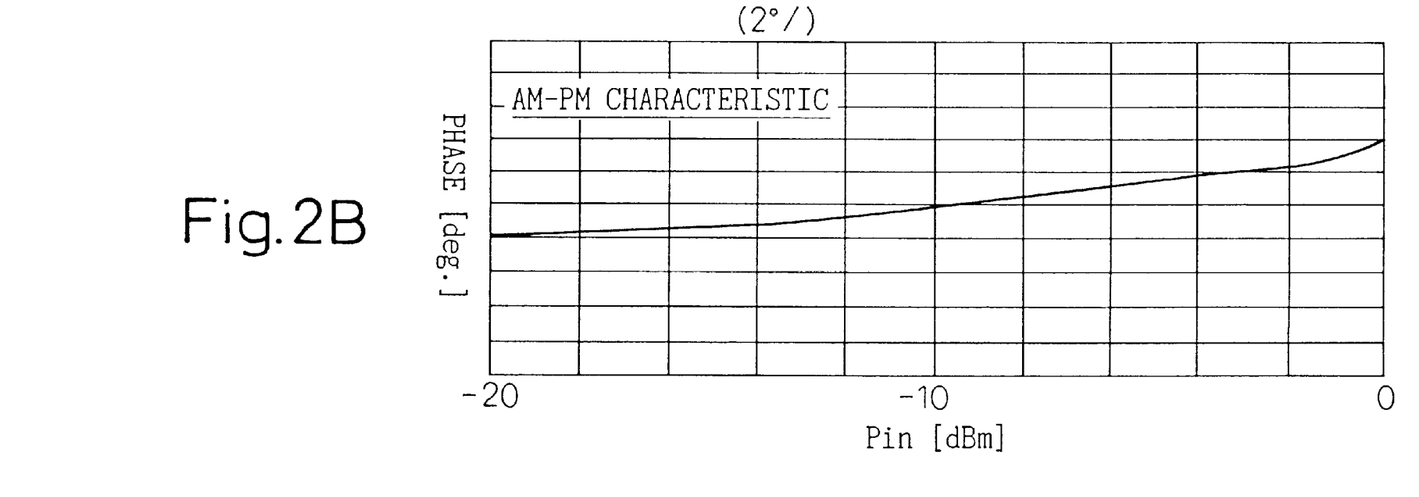
FIG. 2B is a graph for explaining a relationship between a phase degree and an input level for an AM-PM characteristic in the case of the GaAs FET.

FIG. 2A is a graph for explaining a relationship between an amplitude level (Gain, dB) and an input level for an AM-AM characteristic in the case of the GaAs FET, and FIG. 2B is a graph for explaining a relationship between a phase degree and an input level for an AM-PM characteristic in the case of the GaAs FET. On the other hand, FIG. 3A is the AM-AM characteristic in the case of the MOS FET, and FIG. 3B is the AM-PM characteristic in the case of the MOS FET.

In FIGS. 2A, 2B, 3A and 3B, these characteristics were measured in the frequency of 2.1 GHz. Further, the input level Pin (dBm) at an abscissa is in the range of –20 to 0 (dBm), and the amplitude (Gain (dB)) at an ordinate is shown by one dB per one scale (i.e., 1 dB/). Still further, the phase (deg.) at the ordinate is shown by 2 degrees per one scale (i.e., 2°/).

Figure 3A:
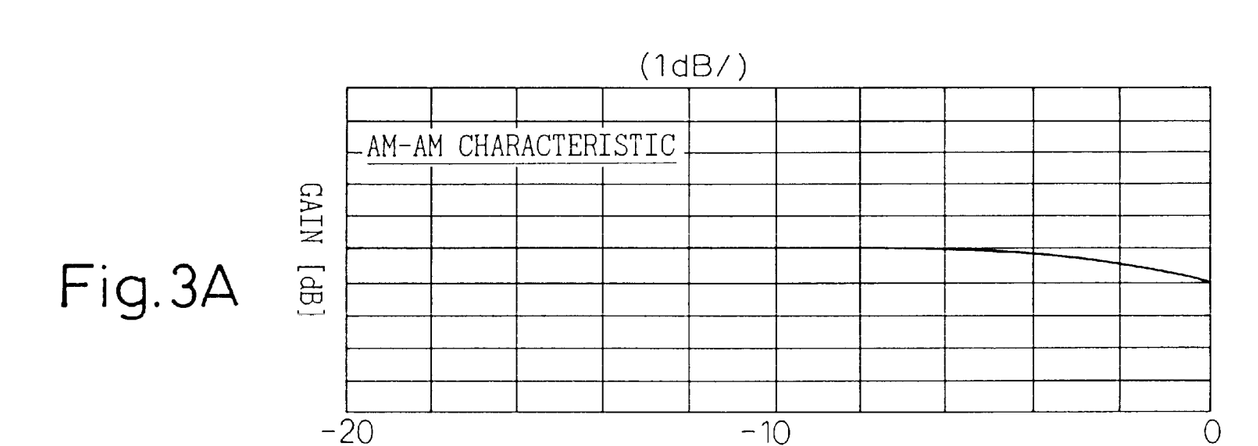
FIG. 3A is the AM-AM characteristic in the case of a MOS FET.
Figure 3B:
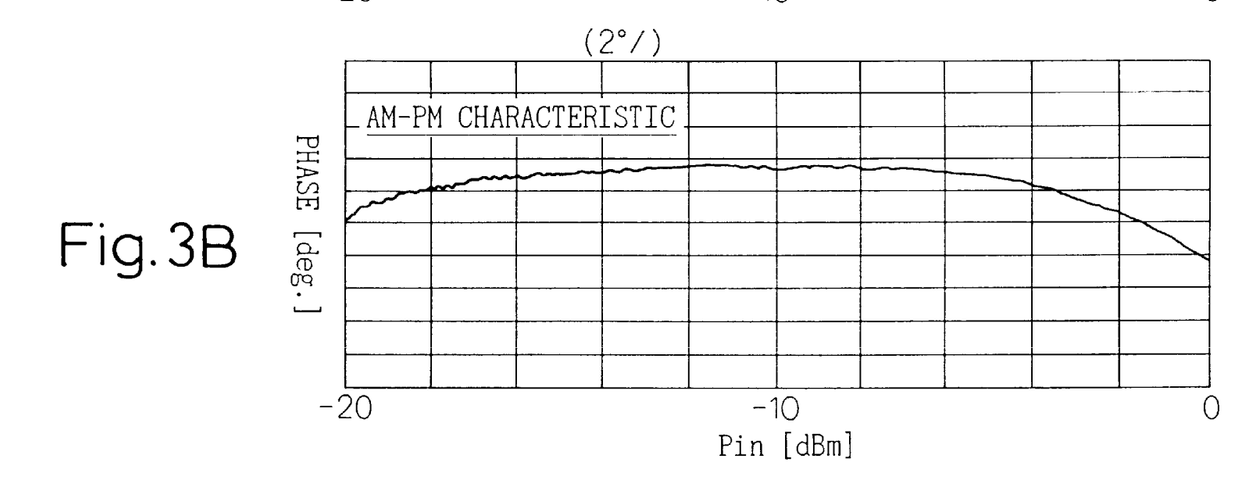
FIG. 3B is the AM-PM characteristic in the case of the MOS FET.

The AM-AM and the AM-PM characteristics shown in FIGS. 3A and 3B are in the case of the amplifier using only MOS FETs. In this case, measuring conditions and the ordinate/abscissa are the same as that of FIGS. 2A and 2B. As is obvious from FIGS. 2A and 3A, the AM-AM characteristic of the GaAs FET amplifier is approximately equal to that of the MOS FET amplifier. However, as is obvious from in FIGS. 2B and 3B, the AM-PM characteristic of the GaAs FET amplifier has inverse phase characteristic for that of the MOS FET amplifier.

Figure 4A:
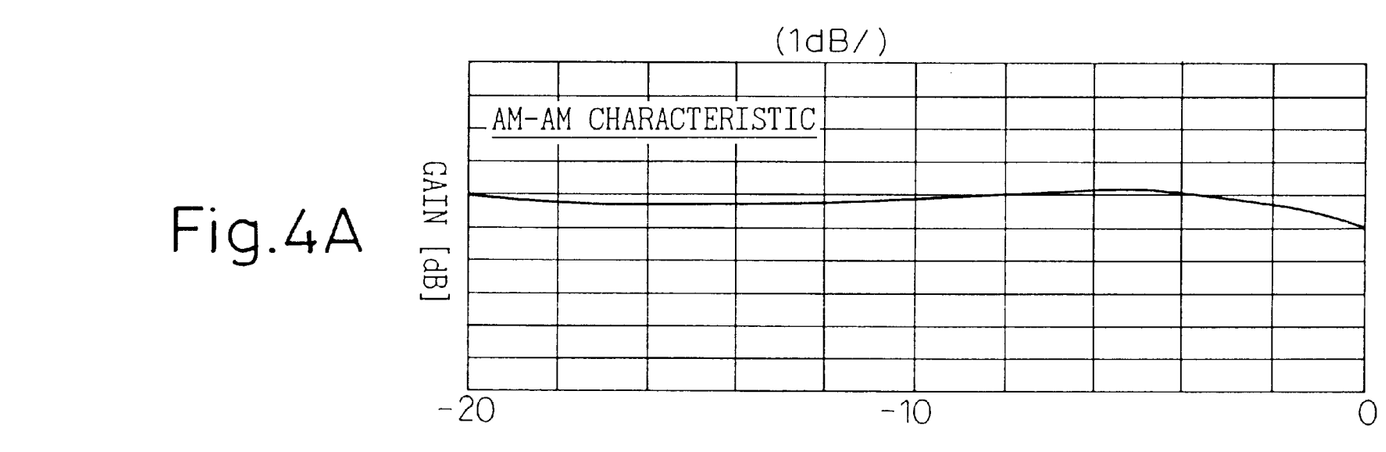
FIG. 4A is a graph for explaining a relationship between an amplitude level (Gain, dB) and an input level for the AM-AM characteristic.
Figure 4B:
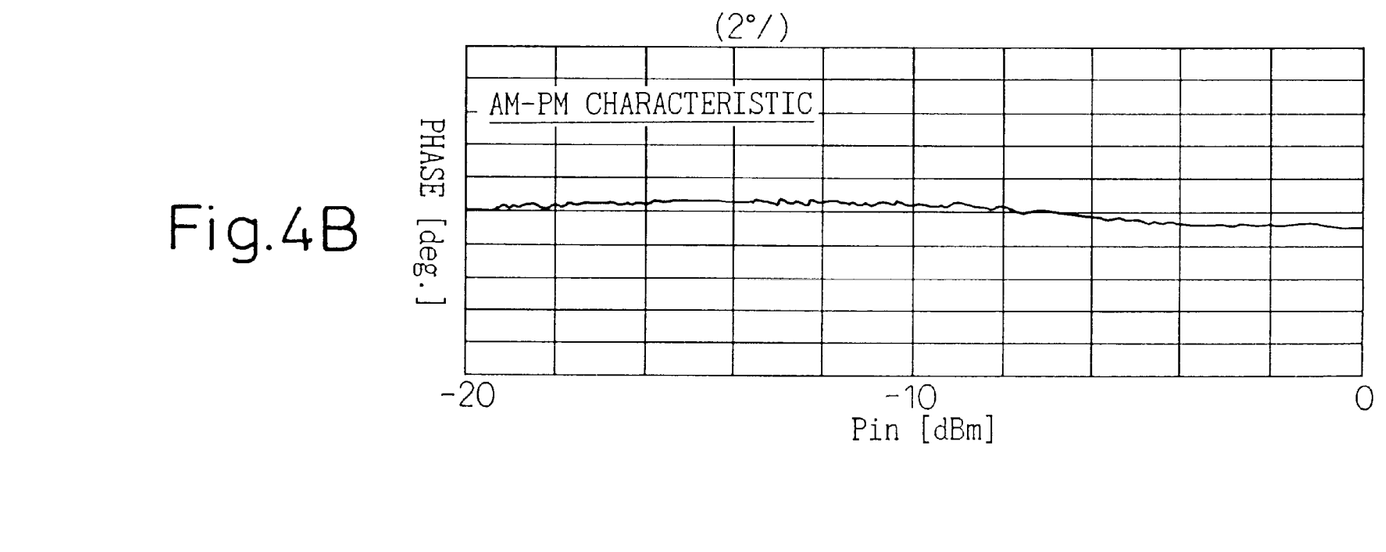
FIG. 4B is a graph for explaining a relationship between a phase degree and an input level for the AM-PM characteristic.

FIG. 4A is a graph for explaining a relationship between an amplitude level (Gain, dB) and an input level for an AM-AM characteristic, and FIG. 4B is a graph for explaining a relationship between a phase degree and an input level for an AM-PM characteristic. In both main amplifier 5 and the sub-amplifier 6, the preceding transistor is the GaAs FET, and the following transistor is the MOS FET. In this case, the measuring conditions of FIGS. 4A and 4B are the same as that of FIGS. 2A and 2B.

As shown by the AM-PM characteristic in FIG. 4B, in the phase correction amplifier according to the embodiment of the present invention, when the input level (Pin (dBm)) is increased, the fluctuation (i.e., change) of the phase is very small so that it is possible to provide an amplifier having improved AM-PM characteristic.

Figure 5A:
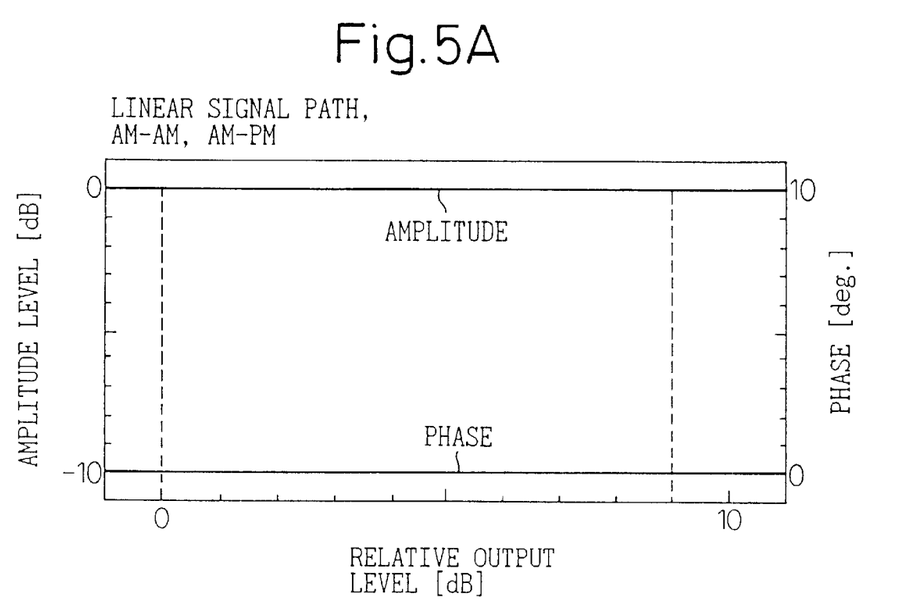
FIG. 5A is a graph for explaining a relationship between an amplitude level/phase degree and a relative output level (dB) for the AM-AM and the AM-PM characteristics on a linear signal path.
Figure 5B:
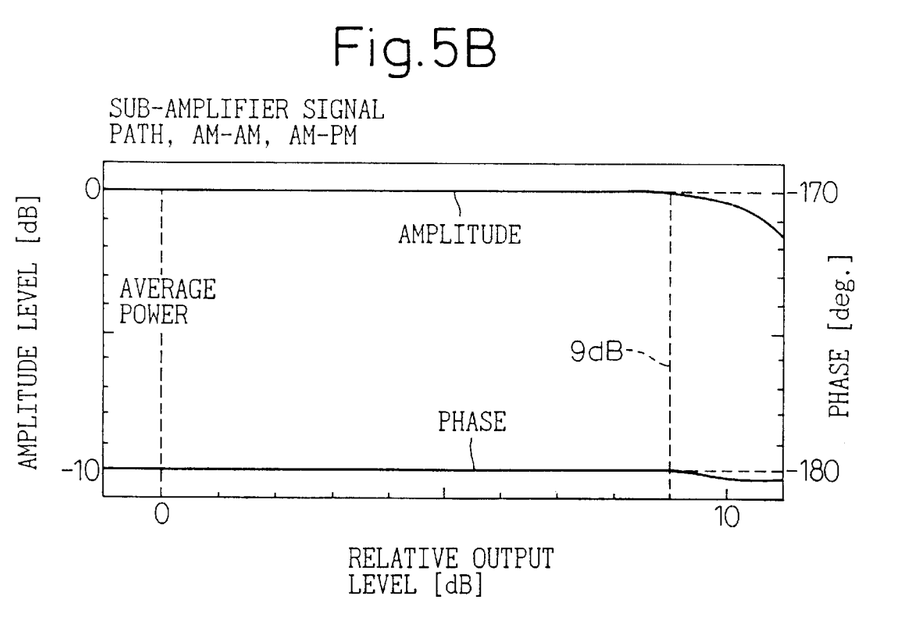
FIG. 5B is a graph for explaining a relationship between an amplitude level/phase degree and a relative output level (dB) for the AM-AM and the AM-PM characteristics on a sub-amplifier signal path.

FIG. 5A is a graph for explaining a relationship between an amplitude level/phase degree and a relative output level (dB) for an AM-AM and AM-PM characteristics on the linear signal path, and FIG. 5B is a graph for explaining a relationship between an amplitude level/phase degree and a relative output level (dB) for an AM-AM and AM-PM characteristics on the sub-amplifier signal path. Further, FIG. 5C is a graph for explaining a relationship between quantity of suppressed distortion and frequencies, and FIG. 5D is another graph for explaining a relationship between quantity of suppressed distortion and frequencies.

In FIGS. 5A and 5B, the AM-AM characteristic represents the characteristic between fluctuation of an input level and fluctuation of an output level, and the AM-PM represents the characteristic between fluctuation of an input level and fluctuation of an output phase. In this case, the graph in FIG. 5A is in the case of fluctuation on the linear signal path 10 in the distortion eliminating loop 4, and the graph in FIG. 5B is in the case of fluctuation on the sub-amplifier signal path 8 in the distortion eliminating loop 4.

The abscissa of FIGS. 5A and 5B show the relative output level (dB), the average power is 0 (dB), and the peak envelope power is 9 (dB). Further, the ordinate shows the amplitude level (dB) and the phase (deg.). In this case, the phase is 0° as a reference level in FIG. 5A, and the phase is 180° as the reference level in FIG. 5B since the phase is inverted.

Figure 5C:
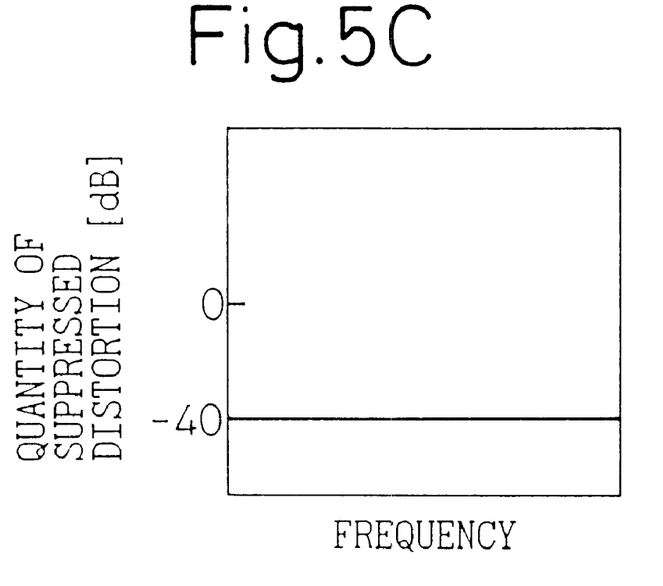
FIG. 5C is a graph for explaining a relationship between quantity of suppressed distortion and frequencies.
Figure 5D:
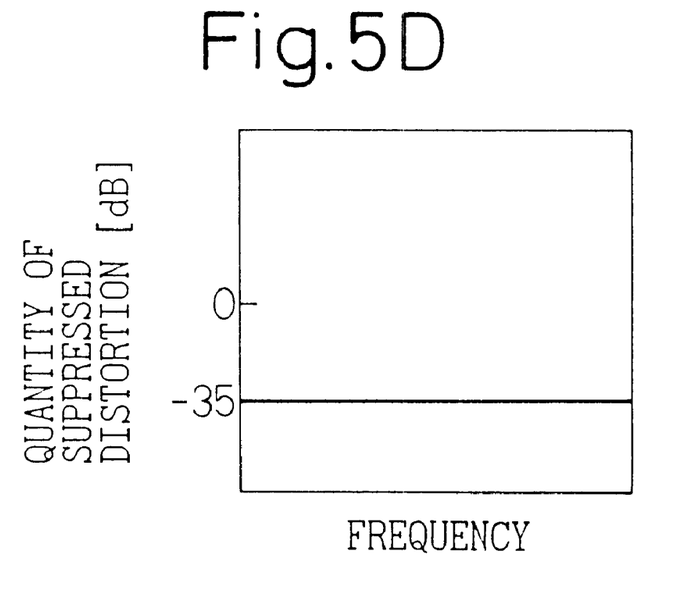
FIG. 5D is another graph for explaining a relationship between quantity of suppressed distortion and frequencies.

When the relative output power is 0 (dB), the quantity of suppressed distortion (dB) at the average power is shown in FIG. 5C. Further, when the peak envelope power is 9 (dB), the quantity of suppressed distortion (dB) is shown in FIG. 5D. In this case, the abscissa shows the frequency, and the ordinate shows the quantity of suppressed distortion.

As is obvious from comparison with FIG. 9, since the sub-amplifier 6 on the sub-amplifier signal path 8 is constituted by the phase correction amplifier, it is possible to realize small fluctuations of the input level at the peak envelope power so that it is possible to obtain the characteristic similar to the characteristic in the case of the linear signal path. Accordingly, since the distortion can be surely eliminated, it is possible to realize –35 dB as the quantity of suppressed distortion as shown in FIG. 5D.

Figure 6:
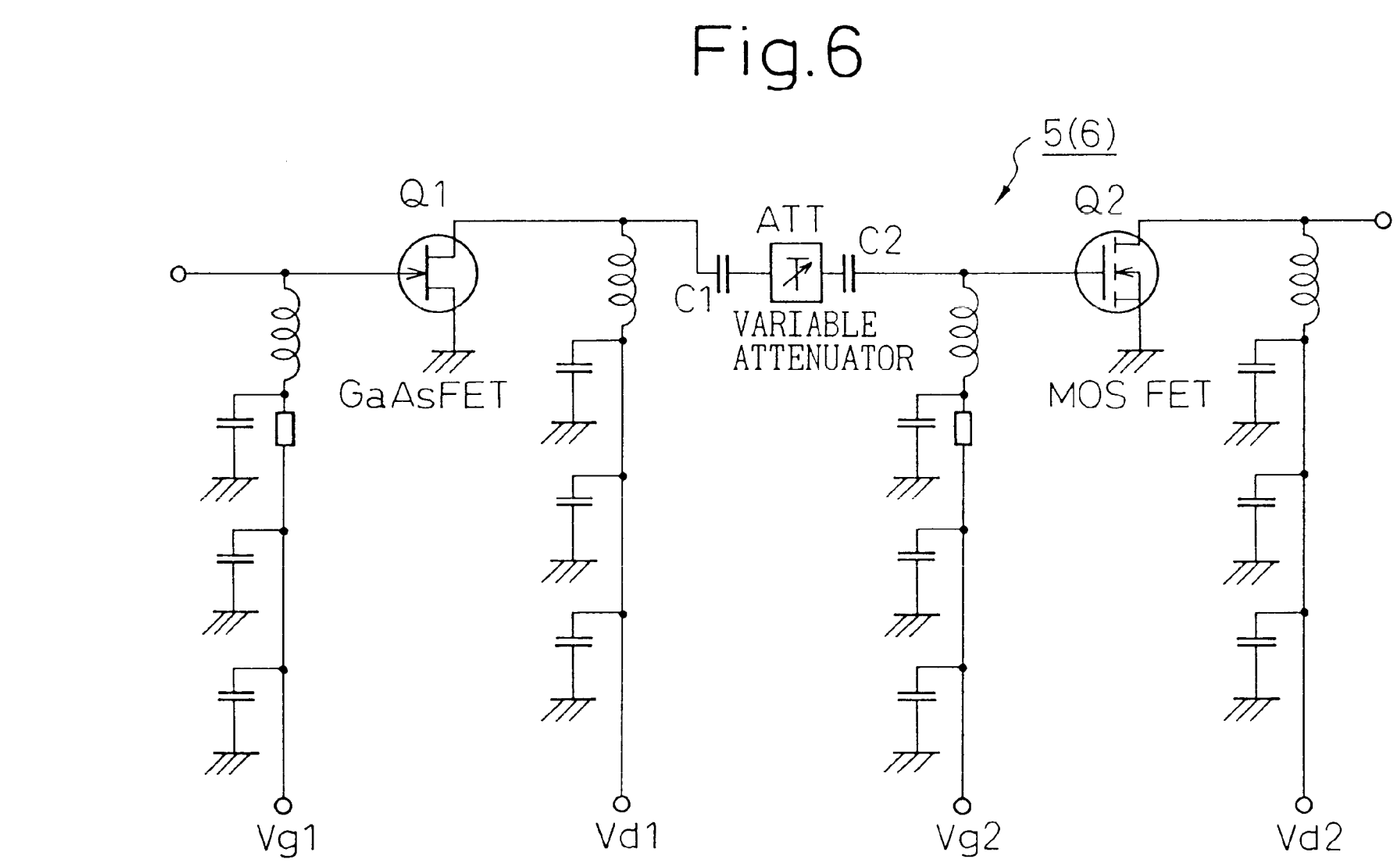
FIG. 6 shows a detailed circuit of a phase correction amplifier according to an embodiment of the present invention.

FIG. 6 shows a detailed circuit of the phase correction amplifier according to the embodiment of the present invention. In the drawing, Q1 is a GaAs FET, and Q2 is a MOS FET. Further, ATT is a variable attenuator, C1 and C2 are coupling condensers, Vg1 and Vg2 are gate bias voltages, and Vd1 and Vd2 are drain voltages. Further, although the remaining circuit, which is constituted by condensers, inductors and resistors, is shown by the distributed constant circuit using strip lines.

In this embodiment, the GaAs FET is used as the preceding transistor, and the MOS FET is used as the following transistor. The preceding transistor Q1 (GaAs FET) is connected to the following transistor Q2 (MOS FET) through the coupling condenser C1, the attenuator ATT and the coupling condenser C2. Accordingly, the input level of the MOS FET can be adjusted by the attenuator ATT so that it is possible to improve precision of the phase correction characteristic.

As another embodiment, the MOS FET can be provided as the preceding transistor, and the GaAs FET can be provided as the following transistor. Further, the attenuator ATT can be eliminated if it is not necessary to adjust the input level of the following transistor.

The drain voltage Vd1 of the GaAs FET is approximately 10 (V), and the drain voltage Vd2 of the MOS FET is approximately 25 (V). As mentioned above, although two kinds of voltages, i.e., 10 (V) and 25 (V), are required as the drain voltage, this is because the desired voltage can be easily obtained by a DC-DC converter.

Figure 7:
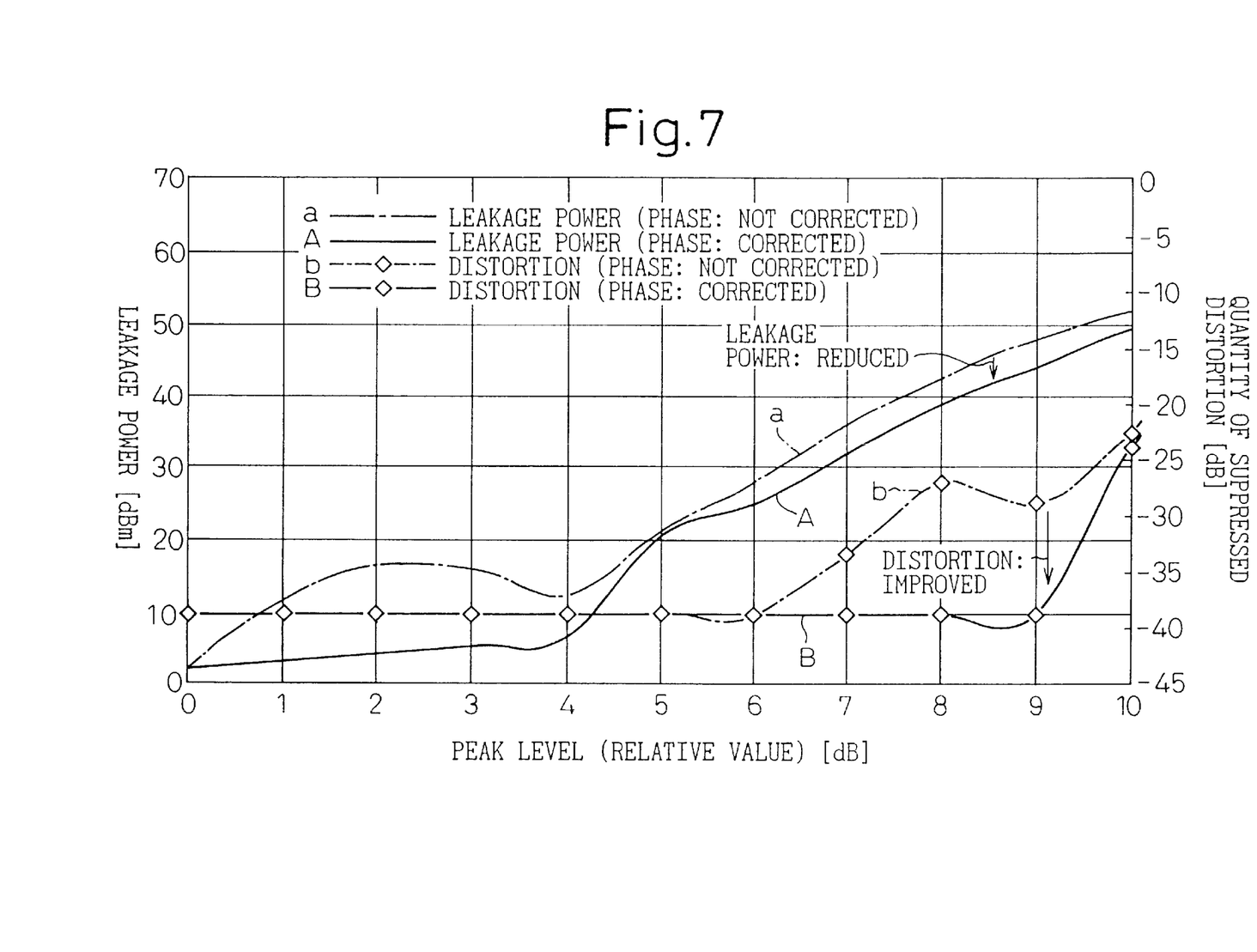
FIG. 7 is a graph for comparing the present invention and the conventional art.

FIG. 7 is a graph for comparing the present invention and the conventional art. In the drawing, thin and thick solid lines (A, B) are in the case of the present invention, and thin and thick chain-dotted lines (a, b) are in the case of the conventional art. Further, the ordinate shows leakage power (dBm), and the abscissa shows peak level (relative value) (dB).

Still further, the thin chain-dotted line "a" represents the leakage power when the phase correction was not performed, and the thin solid line "A" represents the leakage power when the phase correction was performed. On the other hand, the thick chain-doted line "b" represents the quantity of suppressed distortion when the phase correction was not performed, and the thick solid line "B" represents the quantity of suppressed distortion when the phase correction was performed.

In this case, the leakage power represents the power which is input to the sub-amplifier signal path (8, 38) in the distortion eliminating loop (4, 34) through the directional coupler (14, 44), without cancellation of the characteristic when vectors are shifted in the non-linear area of the AM-AM and AM-PM characteristics. Accordingly, when the linear characteristic of the main amplifier is bad so that the AM-AM and AM-PM characteristics are shifted, the leakage power on the signal path (8, 38) becomes large, and the operation level of the sub-amplifier becomes high. Necessarily, the operation in the non-linear area makes a feed-forward compensating characteristic worse, and the distortion characteristic also becomes worse.

Accordingly, as the relationship between the leakage power and the distortion component, it is possible to explain that the distortion component includes the peak leakage power and is input to the sub-amplifier signal path (8, 38). That is, when the linear characteristic of the main amplifier is good, the distortion component can be expressed as a low peak distortion. On the other hand, when the linear characteristic of the main amplifier is bad, the distortion component can be expressed as a high peak distortion.

In the present invention, since the main amplifier 5 in the distortion extracting loop 3 is constituted by the phase correction amplifier, even if the peak level (dB) is high, the leakage power is reduced by several dB compared to the conventional art as shown by the thin solid line "A" in the graph.

On the other hand, in the quantity of suppressed distortion according to the present invention, −40 (dB) can be maintained until the peak level is 9 (dB) as shown by the thick solid line "B". In the conventional art, however, when the peak level exceeds 6 (dB), the quantity of suppressed distortion is reduced, and when the peak level is 8 (dB), the quantity of suppressed distortion becomes approximately −27 (dB) as shown by the thick chain-dotted line "b".

That is, according to the present invention, the quantity of suppressed distortion can be considerably improved as shown by an arrow on the curve "B". Further, since the phase characteristic of the MOS FET is similar to that of the Si-bipolar, it is possible to constitute the phase correction amplifier by combining the GaAs FET with the Si-bipolar.

What is claimed is:

1. A feed-forward amplifier comprising:
    a distortion extracting loop consisting of a main amplifier signal path and a linear signal path in order to distribute a transmission signal;
    a directional coupler for receiving an output signal through the main amplifier signal path and an output signal through the linear signal path;
    a distortion eliminating loop consisting of a sub-amplifier signal path and a linear signal path in order to input an output signal from the directional coupler; and
    a power compositor for receiving an output signal through the sub-amplifier signal path and an output signal through the linear signal path, and coupling both the output signals; wherein
    each of the main amplifier and the sub-amplifier is constituted by a phase correction amplifier comprising a GaAs field effect transistor, and a Si field effect transistor or a Si bipolar transistor, wherein the GaAs field effect transistor and the Si field effect transistor or the Si bipolar transistor are cascade-connected each other through a variable attenuator.

* * * * *